United States Patent [19]

Cubbison, Jr.

[11] 4,272,735

[45] Jun. 9, 1981

[54] SINGLE AMPLIFIER VARIABLE GYRATOR

[75] Inventor: Richard J. Cubbison, Jr., Littleton, Colo.

[73] Assignee: Bell Telephone Laboratories, Incorporated, Murray Hill, N.J.

[21] Appl. No.: 131,898

[22] Filed: Mar. 20, 1980

[51] Int. Cl.³ .................. H03B 5/08; H03H 11/42; H03H 11/50; 331 108 B;108 D;110;115;167
[52] U.S. Cl. ......................... 331/108 B; 331/110; 333/215
[58] Field of Search .......................... 333/215

[56] References Cited

PUBLICATIONS

A 'Simplified' Notch Filter Design, R. E. Williams, Electronic Design 23, Nov. 8, 1976 pp. 68, 69.
Orchard et al., New Active Gyrator Circuits, Electronics Letters, vol. 10, Jun. 1974, pp. 261, 262.

Primary Examiner—Paul L. Gensler
Attorney, Agent, or Firm—James M. Graziano

[57] ABSTRACT

The subject gyrator circuit is realized by a single amplifier and six resistors, which resistors are selected to satisfy a single equation. This permits great flexibility in setting the $Z_{12}$ and $Z_{21}$ impedance values without affecting the stability of the basic circuit.

15 Claims, 9 Drawing Figures

SINGLE AMPLIFIER VARIABLE GYRATOR

FIELD OF THE INVENTION

This invention relates to gyrator circuits and, in particular, to a gyrator circuit realized by a single amplifier and six resistors, which gyrator has variable impedance characteristics.

DESCRIPTION OF THE PRIOR ART

A gyrator is a nonreciprocal two-port which satisfies the following impedance relationship:

$$Z = \begin{bmatrix} 0 & Z_{12} \\ Z_{21} & 0 \end{bmatrix} \text{ where } Z_{12} < 0 < Z_{21} \quad (1)$$

or $$Z_{21} < 0 < Z_{12}$$

AND for both situations $$|Z_{12}|, |Z_{21}| > 0$$

A gyrator is a basic circuit building block which has wide application in realizing more complex circuits. In particular, practical applications of a gyrator circuit are generally obtained by terminating one or both of its ports with various circuit elements. An example is that by terminating one gyrator port with a capacitor, you can realize a lossless inductor at the other port.

Prior art gyrator circuits require the use of two or more operational amplifiers to realize a gyrator function with zero main diagonal terms and sufficient stability to make the circuit practical. An exception to this level of complexity is a gyrator disclosed by Messrs. Orchard and Wilson in an article entitled "New Active Gyrator Circuits", published in Electronics Letters, Vol. 10, pp. 261–262, in June of 1974. The Orchard and Wilson design realizes a gyrator, whose ports have a common terminal, with one operational amplifier and six resistors.

While the number and type of elements required to realize a gyrator are the same in both the circuit of the present invention and the circuit of the Orchard and Wilson article, the two gyrator circuits are totally different in structure. In particular, the gyrator of Orchard and Wilson requires that two independent equations involving all six resistors be satisfied in order to obtain the zero main diagonal terms in the above impedance matrix. In doing so, two interactive resistor adjustments must be made and the impedance values permissible are severely limited.

SUMMARY OF THE INVENTION

The gyrator circuit of my invention employs a single amplifier and six resistors to realize the gyrator function. In the configuration disclosed, the $Z_{11}$ term of the characteristic impedance matrix is always automatically zero, and only the $Z_{22}$ term must be forced to zero. Thus, the gyrator of the present invention is implemented by selecting elements which satisfy a single equation, and the impedance values permissible thereby cover a wide range of values. Thus, the gyrator of the present invention has great flexibility and is stable over a wide range of component values, and is easier to adjust in manufacture.

The impedance characteristics of this gyrator circuit can be determined by selecting resistor ratios as opposed to actual resistor values. Thus, a substantial accuracy advantage is obtained in this fashion and fairly precise impedance values can be obtained. Also, this circuit is configured such that by varying certain ones of the resistor elements, the $Z_{12}$ and $Z_{21}$ impedance characteristics of the gyrator may be varied without affecting the stability of the circuit or the main diagonal zeroes. This capability provides a wider range of impedance values that are realizable.

DETAILED DESCRIPTION

Figure 1:
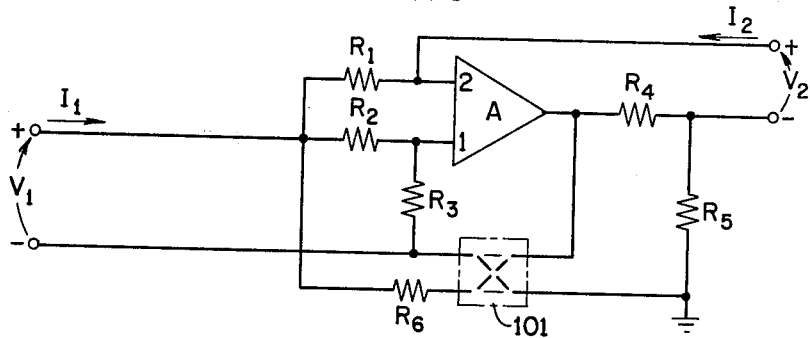
FIG. 1 illustrates the preferred embodiment of the gyrator circuit of my invention in general form.

The preferred embodiment of my invention is disclosed in FIG. 1 wherein a single voltage controlled voltage source A is combined with six impedances (shown as resistors) $R_1$–$R_6$ to realize a gyrator function. In particular, the first port of the gyrator is identified by voltage $V_1$ and current $I_1$ appearing at its terminals with the polarity and direction indicated on FIG. 1, while voltage $V_2$ and current $I_2$ similarly identify the second port of the gyrator. Voltage controlled voltage source A has first (1) and second (2) inputs, which inputs are connected via resistors $R_2$ and $R_1$ respectively to the first terminal of the gyrator's first port. Resistor $R_3$ connects the first voltage source input to the second terminal of the gyrator's first port while resistor $R_5$ grounds one of the terminals of the gyrator's second port. This last-mentioned second port terminal is connected to the output of voltage controlled voltage source A via resistor $R_4$ and the other second port terminal is directly connected to the second input of voltage controlled voltage source A.

One of the first port terminals of the gyrator must be grounded and the selection of the appropriate terminal depends on the implementation of voltage controlled voltage source A, as will be discussed hereinbelow. Thus, box 101 on FIG. 1 diagrammatically illustrates the two options available. The first option is to ground the first terminal of the first port by connecting resistor $R_6$ to ground while the second terminal of the first port is connected to the output of the voltage controlled voltage source. The second option is the converse of the first with $R_6$ being connected to the output of the voltage controlled voltage source and the second terminal of the first port is grounded.

Figure 2:
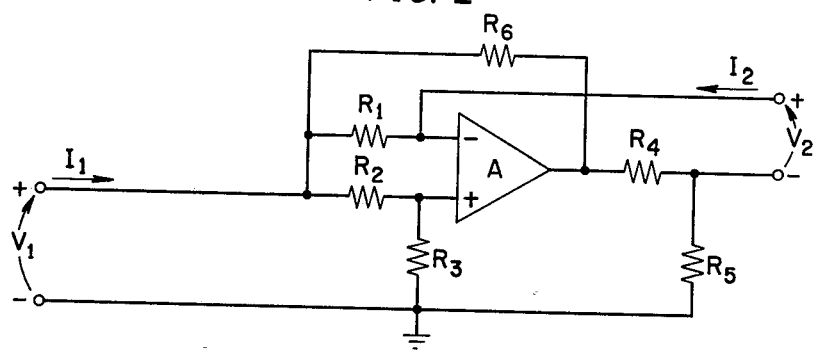
FIGS. 2 and 3 illustrate alternative embodiments of the gyrator circuit of my invention.
Figure 3:
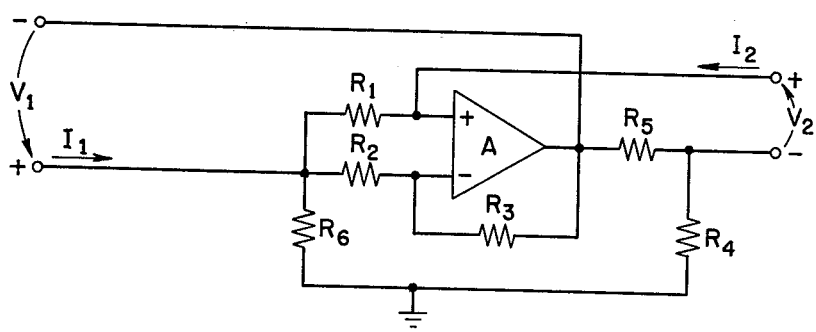

This configuration can be clarified by referring to FIGS. 2 and 3 wherein the gyrator having each of the two specific voltage controlled voltage source implementations is disclosed. In particular, FIG. 2 shows the situation wherein voltage controlled voltage source A has been implemented by an operational amplifier having infinite gain and also having an inverting (−) input, a noninverting (+) input and an output. A nullator-norator pair could be used to realize voltage controlled voltage source A (with the nullator being the input terminal) but for simplicity an operational amplifier realization will be discussed herein. In FIG. 2, the inverting (−) input corresponds to the second (2) input of FIG. 1 and the noninverting (+) input corresponds to the first (1) input. With this selection of input terminals for voltage controlled voltage source A, resistor $R_6$ is connected to the output of voltage controlled voltage source A and the second terminal of the first port of the gyrator is connected to circuit ground. FIG. 3 illustrates the opposite operational amplifier polarity selection, which then requires that resistor $R_6$ be grounded, the second terminal of the first port of the gyrator is connected to the output of voltage controlled voltage source A and resistors $R_4$ and $R_5$ are interchanged.

The circuit configurations disclosed in both FIGS. 2 and 3 can be described by the following characteristic impedance matrix:

$$\begin{bmatrix} V_1 \\ V_2 \end{bmatrix} = \begin{bmatrix} 0 & Z_{12} \\ Z_{21} & Z_{22} \end{bmatrix} \begin{bmatrix} I_1 \\ I_2 \end{bmatrix} \quad (2)$$

where $$Z_{22} = R_1 \left( \frac{\frac{R_6}{R_2}}{1 + \frac{R_4}{R_5}} \right) \cdot \left( 1 + \frac{R_2}{R_1} + \frac{R_2}{R_6} + \frac{R_2 R_4}{R_1 R_6} - \frac{R_3 R_4}{R_6 R_5} \right). \quad (3)$$

$Z_{22}=0$ and the above characteristic impedance matrix is that of a gyrator if and only if:

$$1 + \frac{R_2}{R_1} + \frac{R_2}{R_6} = \frac{R_4}{R_6} \left( \frac{R_3}{R_5} - \frac{R_2}{R_1} \right) \quad (4)$$

Thus, when this condition is satisfied, $$V_1 = Z_{12} I_2 = -R_1 \left( 1 + \frac{R_3}{R_2} \right) I_2 \quad (5)$$

and $$V_2 = Z_{21} I_1 = R_6 \left( \frac{1}{1 + \frac{R_4}{R_5}} \right) I_1 \quad (6)$$

and the circuit of FIGS. 2 and 3 realize a gyrator function.

Thus, the circuit of FIG. 1 (and its two realizations in FIGS. 2 and 3) permits the impedances $Z_{12}$ and $Z_{21}$ to be selected from a wide range of values, with a certain amount of flexibility in the selection process due to the need to satisfy only a single equation to make the $Z_{22}$ term equal zero.

Figure 4:
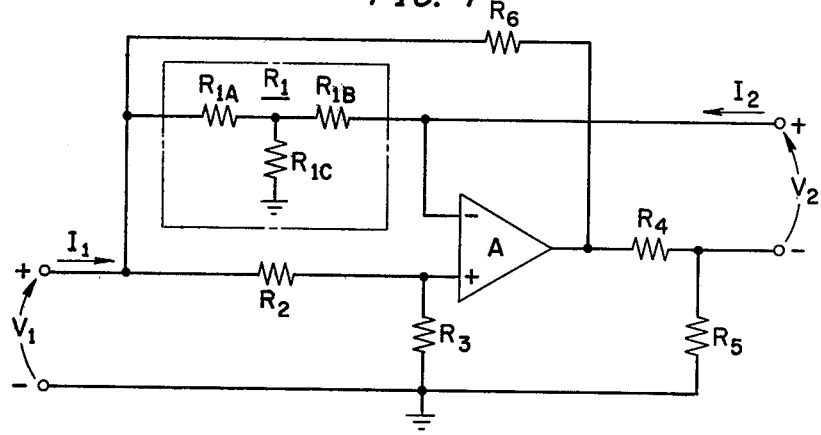
FIGS. 4–6 illustrate variations of the gyrator circuit of FIG. 2.

The circuit of FIG. 4 illustrates a slightly modified version of the gyrator circuit of FIG. 2 wherein resistor $R_1$ has been replaced by three individual resistors $R_{1A}$-$R_{1C}$ in a "tee" configuration. This configuration permits impedance $Z_{12}$ to be further modified, by varying $R_{1C}$, without affecting impedance $Z_{21}$ or the main diagonal zeroes at all. In particular, $$Z_{22} = 0 \text{ if and only if } \frac{R_4}{R_6} = \frac{R_{1B}}{R_{1A}} \quad (7)$$

and $$\frac{R_3}{R_5} = \frac{R_2}{R_{1B}} + \frac{R_2}{R_4} + \frac{R_6}{R_4} \quad (8)$$

Then, as with the circuit in FIG. 1.

$$Z_{21} = R_6 \left( \frac{1}{1 + \frac{R_4}{R_5}} \right) \quad (9)$$

However, $$Z_{12} = -R_{1A} \left( 1 + \frac{R_3}{R_2} \right) \quad (10)$$

$$\left( \frac{1 + \frac{R_{1B}}{R_{1A}} + \frac{R_{1B}}{R_{1C}}}{1 - \frac{R_3}{R_2} \frac{R_{1A}}{R_{1C}}} \right)$$

Figure 5:
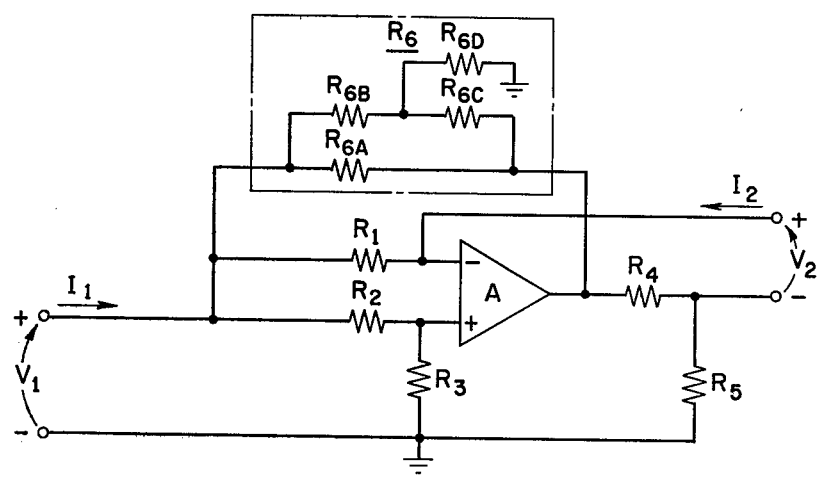

An analogous result with respect to $Z_{21}$ can be obtained by replacing the resistor $R_6$ of FIG. 2 by four resistors configured as shown in FIG. 5. Resistor $R_{6A}$ is connected as was the original resistor $R_6$ while the three resistors $R_{6B}$-$R_{6D}$ are configured in a "tee" arrangement with the center leg of the "tee" being grounded, while the other two arms of the "tee" are connected one to each end of resistor $R_{6A}$. This configuration permits impedance $Z_{21}$ to be further modified, by varying $R_{6B}$, without affecting impedance $Z_{12}$ or the main diagonal zeroes at all. In particular, $Z_{22}=0$ if and only if $$\frac{R_4}{R_{6A}} \left( \frac{R_3}{R_5} - \frac{R_2}{R_1} \right) = 1 + \frac{R_2}{R_1} + \frac{R_2}{R_{6A}} \quad (11)$$

and $$\frac{R_{6C}}{R_{6D}} \left( \frac{R_2}{R_{6A}} + \frac{R_3}{R_{6A}} \right) = 1 + \frac{R_2}{R_1} \quad (12)$$

Then, as with the circuit in FIG. 2, $$Z_{12} = -R_1 \left( 1 + \frac{R_3}{R_2} \right) \quad (13)$$

However, $$Z_{21} = R_{6A} \left( \frac{1}{1 + \frac{R_4}{R_5}} \right) \cdot \left( \frac{1}{1 + \frac{R_{6A}}{R_{6B} + R_{6C} + \frac{R_{6B} R_{6C}}{R_{6D}}}} \right) \quad (14)$$

Figure 6:
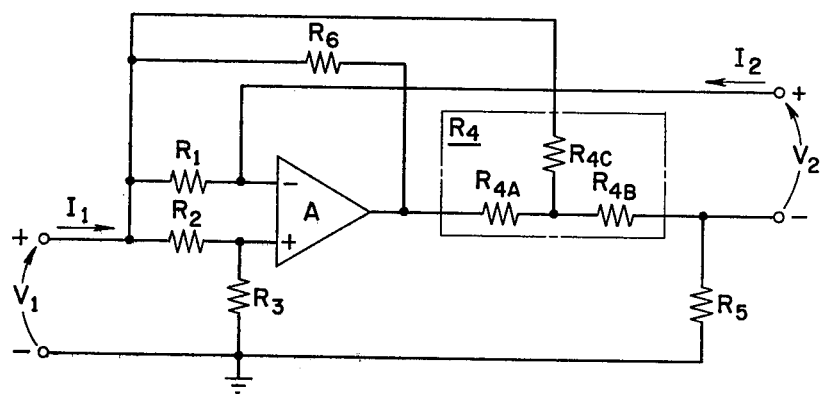

Another way of varying impedance $Z_{21}$ is by replacing the resistor $R_4$ of FIG. 2 with a "tee" configuration of three resistors $R_{4A}$-$R_{4C}$ with the center leg of the "tee" being connected to the ungrounded terminal of the first port as shown in FIG. 6. This configuration permits impedance $Z_{21}$ to be further modified, by varying $R_{4C}$, without affecting impedance $Z_{12}$ or the main diagonal zeroes at all. In particular, $Z_{22}=0$ if and only if $$\left(\frac{R_{4A} + R_{4B}}{R_6}\right)\left(\frac{R_3}{R_5} - \frac{R_2}{R_1}\right) = 1 + \frac{R_2}{R_1} + \frac{R_2}{R_6} \quad (15)$$

and $$\frac{R_3}{R_5} - \frac{R_2}{R_{4B}} + \frac{R_2}{R_1} \quad (16)$$

Then, as with the circuit in FIG. 2, $$Z_{12} = -R_1\left(1 + \frac{R_3}{R_2}\right). \quad (17)$$

However, $$Z_{21} = \frac{R_6}{1 + \frac{R_{4A} + R_{4B}}{R_5} + \frac{R_6 + R_{4A}}{R_{4C}}\left(1 + \frac{R_{4B}}{R_5}\right)} \quad (18)$$

Figure 7:
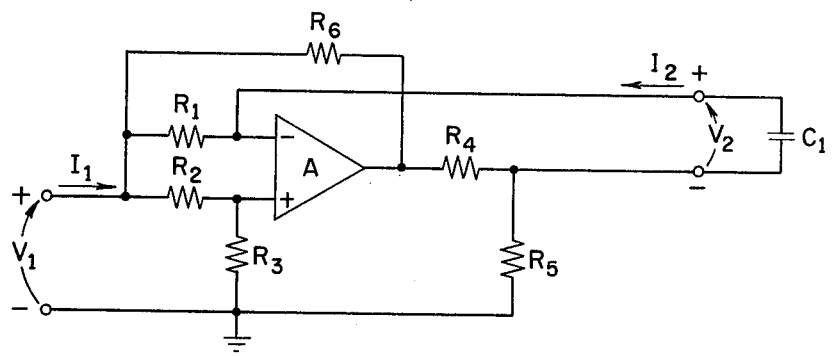
FIG. 7 illustrates an active inductor circuit realized by terminating one port of the gyrator circuit of my invention with a capacitor.
Figure 8:
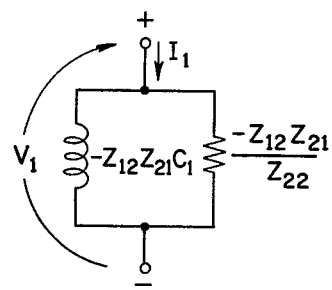
FIG. 8 illustrates schematically the characteristics of the active inductor circuit of FIG. 7.

The gyrator circuits of FIGS. 1-6 find application in any number of situations. One such application is that of realizing an active inductor, which circuit is illustrated in FIG. 7 wherein the gyrator circuit of FIG. 2 has attached to its second port capacitor $C_1$. The resultant circuit comprises an inductor connected in parallel with a resistor, which configuration is illustrated schematically in FIG. 8. It should be noted that the $Z_{12}$ term is always negative so that the inductor is positive, while the resistor can be positive, negative, or infinite depending on the value of $Z_{22}$. Thus, $$V_1 = \left(\frac{-Z_{12} Z_{21}}{\frac{1}{SC_1} + Z_{22}}\right) I_1 \quad (19)$$

Figure 9:
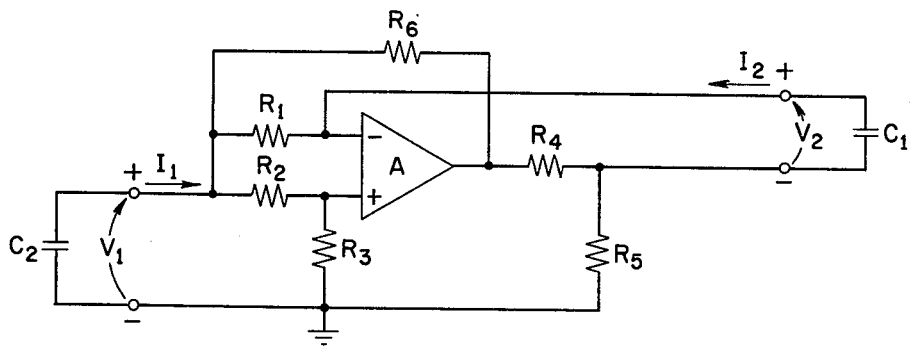
FIG. 9 illustrates an oscillator circuit realized by terminating both ports of the gyrator circuit of my invention with capacitors.

Another application for the gyrator circuit of FIG. 2 is that of realizing an oscillator. This is accomplished by taking the circuit of FIG. 7 and attaching a capacitor $C_2$ on its first port as illustrated in FIG. 9. The output of the oscillator would be taken from the output of operational amplifier A. The $Z_{22}$ term must also be zero.

Thus, the above descriptions illustrate the gyrator circuit of my invention and several applications of the circuit. It should be noted again that an ideal amplifier with infinite gain was assumed for the description. In practical applications many factors will slightly alter the characteristics of the circuits illustrated herein. In particular, there will be error terms introduced by element tolerances, temperature coefficients, amplifier slew rates, etc. However, the basic structure taught herein still represents a novel and highly useful configuration.

While a specific embodiment of the invention has been disclosed, variations in structural detail, within the scope of the appended claims, are possible and are contemplated. There is no intention of limitation to what is contained in the abstract or the exact disclosure as herein presented. The above-described arrangements are only illustrative of the application of the principles of the invention. Normally, other arrangements may be devised by those skilled in the art without departing from the spirit and the scope of the invention.

I claim:

1. A gyrator with variable impedance characteristics having a first terminal of the first port, a second terminal of the first port and a pair of terminals for the second port comprising:

voltage source means (A) having a first input (1), a second input (2), an output;

first impedance means ($R_1$) connected from said second voltage source means input (2) to said first terminal of the first port;

second impedance means ($R_2$) connected from said first voltage source means input (1) to said first input terminal;

third impedance means ($R_3$) connected from said first voltage source means input (1) to said second terminal of the first port;

fourth impedance means ($R_4$) connected from said voltage source means output to a first of said pair of terminals for the second port;

fifth impedance means ($R_5$) connected from said first terminal of the second port to circuit ground;

wherein said second voltage source means input (2) is also directly connected to the second of said terminals of the second port; and wherein the first of said first port terminals is connected by a sixth impedance means ($R_6$) to circuit ground or said voltage source means output while the second of said first port terminals is connected to said voltage source means output or to circuit ground respectively.

2. The invention of claim 1 wherein said voltage source means (A) comprises a voltage controlled voltage source (A).

3. The invention of claim 2 wherein said voltage controlled voltage source (A) comprises an operational amplifier.

4. The invention of claim 2 wherein said voltage controlled voltage source (A) comprises a nullator-norator combination with said nullator being connected to said voltage source input (1, 2) and said norator being connected between said voltage source output and circuit ground.

5. The invention of claim 2 wherein said voltage controlled voltage source (A) has an inverting input (−), a noninverting input (+) and an output with said inverting input (−) corresponding to said second voltage source input (2), said noninverting input (+) corresponding to said first voltage source input (1), and said output corresponding to said voltage source output.

6. The invention of claim 5 wherein said second terminal of the first port is connected to circuit ground and said first terminal of the first port is connected via said sixth impedance means ($R_6$) to said voltage source output.

7. The invention of claim 6 wherein said first through said sixth ($R_1$-$R_6$) impedance means comprise resistors and satisfy the following relationship:

$$1 + \frac{R_2}{R_1} + \frac{R_2}{R_6} = \frac{R_4}{R_6}\left(\frac{R_3}{R_5} - \frac{R_2}{R_1}\right)$$

8. The invention of claim 2 wherein said fourth impedance means (R$_4$) and said fifth impedance means are interchanged; and wherein said voltage controlled voltage source (A) has an inverting input (−), a noninverting input (+) and an output with said inverting input (−) corresponding to said first voltage source input (1), said noninverting input (+) corresponding to said second voltage source input (2), and said output corresponding to said voltage source output.

9. The invention of claim 8 wherein said second terminal of the first port is connected to said voltage source output and said first terminal of the first port is connected via said sixth impedance means (R$_6$) to circuit ground.

10. The invention of claim 9 wherein said first through said sixth (R$_1$–R$_6$) impedance means comprise resistors and satisfy the following relationship:

$$1 + \frac{R_2}{R_1} + \frac{R_2}{R_6} = \frac{R_4}{R_6}\left(\frac{R_3}{R_5} - \frac{R_2}{R_1}\right)$$

11. The invention of claim 10 wherein said first impedance means (R$_1$) comprises:

seventh (R$_{1A}$), eighth (R$_{1B}$), and ninth (R$_{1C}$) impedance means connected together in a "tee" configuration with said seventh (R$_{1A}$) impedance means being connected to said first terminal of the first port, said eighth (R$_{1B}$) impedance means being connected to said second input of said voltage controlled voltage source (A), said ninth (R$_{1C}$) impedance means being connected to said second terminal of the first port, and wherein said impedance means satisfy the following relationships:

$$\frac{R_4}{R_6} = \frac{R_{1B}}{R_{1A}}$$

and $$\frac{R_3}{R_5} = \frac{R_2}{R_{1B}} + \frac{R_2}{R_4} + \frac{R_6}{R_4}$$

12. The invention of claim 10 wherein said sixth impedance means (R$_6$) comprises:

tenth (R$_{6A}$), eleventh (R$_{6B}$), twelfth (R$_{6C}$), and thirteenth (R$_{6D}$) impedance means connected together in a divider configuration with said tenth (R$_{6A}$) impedance means being connected exactly as said sixth impedance means (R$_6$), said eleventh (R$_{6B}$) and said twelfth (R$_{6C}$) impedance means being connected in series, the combination also being connected in parallel with said tenth (R$_{6A}$) impedance means with said eleventh impedance means (R$_{6B}$) being connected to said first terminal of the first port, said thirteenth (R$_{6D}$) impedance means being connected between said second terminal of the first port and the junction of said eleventh (R$_{6B}$) and said twelfth (R$_{6C}$) impedance means, and wherein said impedance means satisfy the following relationships:

$$\frac{R_4}{R_{6A}}\left(\frac{R_3}{R_5} - \frac{R_2}{R_1}\right) = 1 + \frac{R_2}{R_1} + \frac{R_2}{R_{6A}}$$

$$\frac{R_{6C}}{R_{6D}}\left(\frac{R_2}{R_{6A}} + \frac{R_3}{R_{6A}}\right) = 1 + \frac{R_2}{R_1}$$

13. The invention of claim 10 wherein said fourth impedance means (R$_4$) comprises:

fourteenth (R$_{4A}$), fifteenth (R$_{4B}$) and sixteenth (R$_{4C}$) impedance means connected together in a "tee" configuration with said fourteenth (R$_{4A}$) impedance means and said fifteenth impedance means (R$_{4B}$) being connected in series between the same terminals connected by said fourth impedance means (R$_4$) with said fifteenth impedance means (R$_{4B}$) being connected to said first terminal of the second port, said sixteenth (R$_{4C}$) impedance means being connected between said first terminal of the first port and the junction of said fourteenth (R$_{4A}$) and said fifteenth (R$_{4B}$) impedance means and wherein said impedance means satisfy the following relationships:

$$\left(\frac{R_{4A} + R_{4B}}{R_6}\right)\left(\frac{R_3}{R_5} - \frac{R_2}{R_1}\right) = 1 + \frac{R_2}{R_1} + \frac{R_2}{R_6}$$

$$\frac{R_3}{R_5} = \frac{R_2}{R_{4B}} + \frac{R_2}{R_1}$$

14. The invention of claim 7 or 10 or 11 or 12 or 13 wherein said gyrator includes:

first capacitance means (C$_1$) connected between said first and said second terminals of the second port for providing an inductance characteristic at the first port.

15. The invention of claim 14 wherein said gyrator includes:

second capacitance means (C$_2$) connected between said first and said second terminals of the first port for providing an oscillator characteristic.

* * * * *